United States Patent
Liang et al.

(10) Patent No.: US 11,081,840 B2
(45) Date of Patent: Aug. 3, 2021

(54) DETECTION CIRCUIT APPLIED TO A CONNECTING PORT

(71) Applicant: ASUSTeK COMPUTER INC., Taipei (TW)

(72) Inventors: Kai-Chun Liang, Taipei (TW); Kian-Ming Chee, Taipei (TW); Wei-Chen Tu, Taipei (TW); Tao Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 210 days.

(21) Appl. No.: 16/424,627

(22) Filed: May 29, 2019

(65) Prior Publication Data

US 2020/0169041 A1    May 28, 2020

(30) Foreign Application Priority Data

Nov. 23, 2018   (CN) .......................... 201811402577.X

(51) Int. Cl.
*H01R 13/641*    (2006.01)
*G01R 31/68*    (2020.01)

(52) U.S. Cl.
CPC ........... *H01R 13/641* (2013.01); *G01R 31/68* (2020.01)

(58) Field of Classification Search
CPC .............................. H01R 13/641; G01R 31/68
See application file for complete search history.

(56) References Cited

U.S. PATENT DOCUMENTS

| 10,290,978 B2* | 5/2019 | Park ..................... H01R 13/622 |
| 2009/0009185 A1* | 1/2009 | Herbst ................. H01R 13/641 |
| | | 324/538 |
| 2011/0020015 A1* | 1/2011 | Nishimura ......... G03G 15/5087 |
| | | 399/13 |
| 2014/0187078 A1* | 7/2014 | Zhou .................. H01R 13/6683 |
| | | 439/489 |
| 2015/0022183 A1* | 1/2015 | Furtner ................ G01R 19/145 |
| | | 324/123 R |

FOREIGN PATENT DOCUMENTS

| CN | 101769976 A | | 7/2010 |
| CN | 103176098 A | | 6/2013 |
| CN | 103176098 B | * | 12/2015 |
| CN | 209880993 U | * | 12/2019 |
| JP | 2010008178 A | * | 1/2014 |
| JP | 2018142118 A | * | 9/2018 |
| JP | 2020141480 A | * | 9/2020 |

* cited by examiner

*Primary Examiner* — Jay Patidar
(74) *Attorney, Agent, or Firm* — McClure, Qualey & Rodack, LLP

(57) ABSTRACT

A detection circuit is provided, including a connector and a processing circuit. The connector comprises a first detection terminal and a second detection terminal. The second detection terminal is electrically connected to a first reference potential. The processing circuit is electrically connected to the first detection terminal and is used for receiving a power supply signal. When the connector is connected to a connecting port, the first detection terminal is electrically connected with the second detection terminal through the connecting port to form an electrical loop, so that the processing circuit detects a detection potential on the first detection terminal, and then determines whether the connector is correctly connected to the connecting port.

8 Claims, 2 Drawing Sheets

DETECTION CIRCUIT APPLIED TO A CONNECTING PORT

CROSS-REFERENCE TO RELATED APPLICATION

This application claims the priority benefit of Chinese application serial No. 201811402577.X, filed on Nov. 23, 2018. The entirety of the above-mentioned patent application is hereby incorporated by reference herein and made a part of the specification.

BACKGROUND OF THE INVENTION

Field of the Invention

The invention relates to a detection circuit, used for detecting whether a connecting port is correctly plugged to a connector.

Description of the Related Art

In various electronic devices, a connector is a key bridge for transmitting power or signals. When using an electronic device, a user needs to plug a connector into a connecting port to allow the electronic device to transmit and receive signals or transmit power. However, the connector generally has multiple terminals inside. If the position of the connecting port is not accurately aligned with the position of the inserted connector, the terminal in the connecting port may not be electrically connected to all the terminals inside the connector, thus resulting in an error in power or signal transmission.

BRIEF SUMMARY OF THE INVENTION

The disclosure provides a detection circuit, which can reduce the design cost of the detection circuit and guarantee the detection accuracy at the same time.

One aspect of the disclosure provides a detection circuit. The detection circuit comprises a connector and a processing circuit. The connector comprises a first detection terminal and a second detection terminal. The second detection terminal is electrically connected to a first reference potential. The processing circuit is electrically connected to the first detection terminal and is used for receiving a power supply signal. When the connector is connected to a connecting port, the first detection terminal is electrically connected with the second detection terminal through the connecting port to form an electrical loop, so that the processing circuit detects a detection potential on the first detection terminal.

In some embodiments, the processing circuit further comprises a comparator and a control circuit. A negative end of the comparator is electrically connected to a second reference potential, a positive end of the comparator is electrically connected to the first detection terminal and is used for receiving the detection potential, and an output end of the comparator is used for outputting a notification signal. The control circuit is electrically connected to the output end of the comparator and is used for implementing power transmission between multiple power terminals on the connector and the connecting port.

In some embodiments, the processing circuit further comprises an analog-to-digital circuit. The analog-to-digital circuit is electrically connected to the first detection terminal and the control circuit and is used for converting the detection potential into a digital notification signal and transmitting the digital notification signal to the control circuit.

In some embodiments, the control circuit is used for controlling power values output by the power terminals according to analysis data after receiving the digital notification signal.

In some embodiments, the detection circuit further comprises a protection circuit. The protection circuit is electrically connected between the processing circuit and the first detection terminal.

In some embodiments, the processing circuit comprises an analog-to-digital circuit and a control circuit. The first end of the analog-to-digital circuit is electrically connected to the first detection terminal and is used for converting the detection potential into a digital notification signal. The control circuit is electrically connected to the second end of the analog-to-digital circuit and is used for implementing power transmission between multiple power terminals on the connector and the connecting port.

In some embodiments, the control circuit is used for controlling power values output by the power terminals according to analysis data after receiving the digital notification signal.

In some embodiments, the connector further comprises multiple power terminals, and the power terminals are arranged between the first detection terminal and the second detection terminal.

Accordingly, the detection circuit of the disclosure determines a plugging state between the connector and the connecting port by configuring the corresponding processing circuit for the first detection terminal according to the fact whether the first detection terminal and the second detection terminal form the electrical loop. Therefore, the design cost of the detection circuit is reduced and the detection accuracy is guaranteed.

DETAILED DESCRIPTION OF THE EMBODIMENTS

Figure 1:
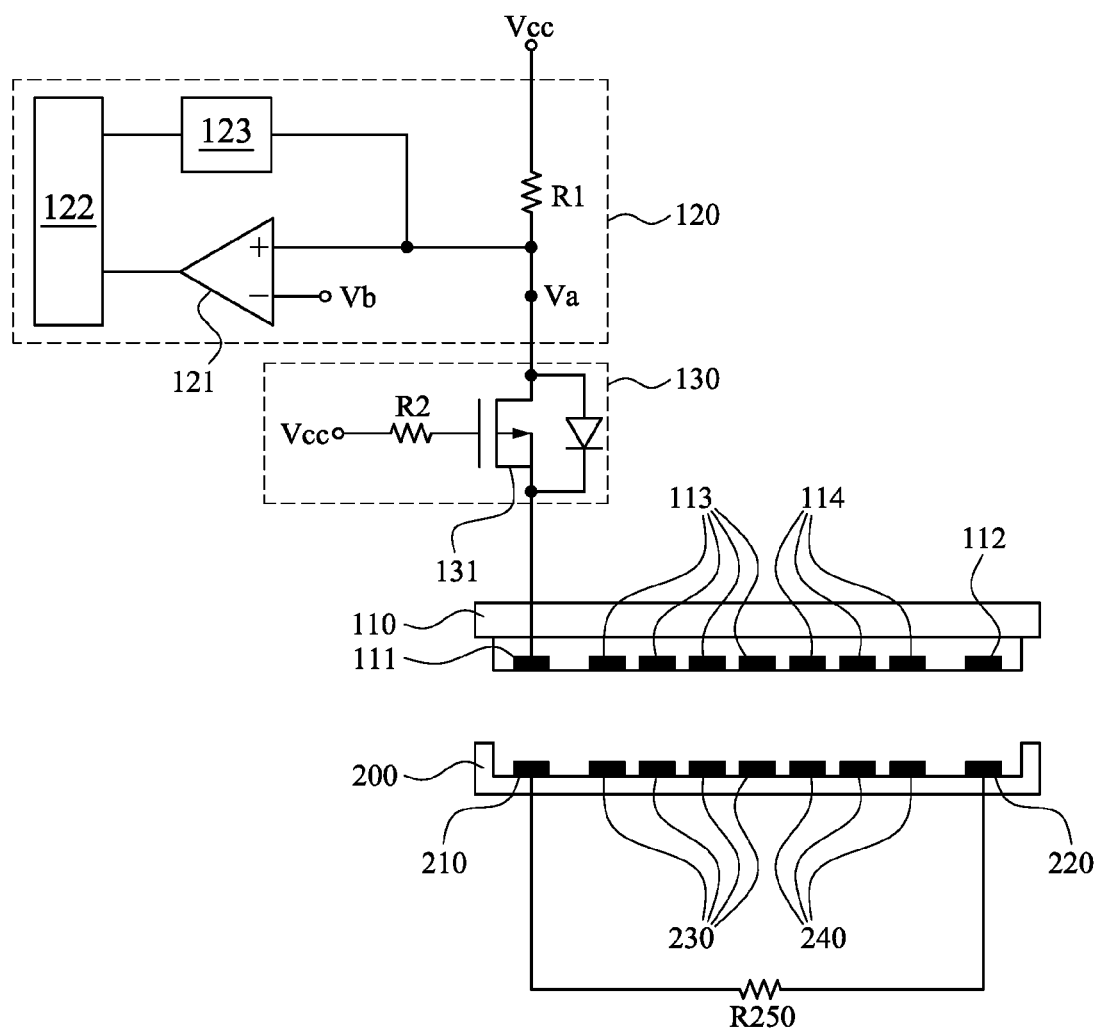
FIG. 1 is a schematic diagram showing a detection circuit drawn according to some embodiments of the disclosure.

Various embodiments of the disclosure will be disclosed in the accompanying drawings, and for purposes of clarity of illustration, numerous practical details will be set forth in the following description. It should be understood, however, that these practical details are not intended to limit the disclosure. That is, in some embodiments of the disclosure, such practical details are unnecessary. In addition, some well-known and customary structures and elements will be shown in the drawings in a simple schematic manner for the sake of simplifying the drawings.

As used herein, an element, when referred to as "connected" or "coupled," may refer to "electrically connected" or "electrically coupled". "Connected" or "coupled" may also be used to mean that two or more elements cooperate or interact with each other. Furthermore, although terms such as "first" and "second" are used to describe different elements herein, the terms are only intended to distinguish elements or operations described with same technical terms.

Unless the context clearly indicates otherwise, the terms neither indicate or imply a sequence or an order, nor limit the disclosure.

The disclosure relates to a detection circuit 100. Referring to FIG. 1, the detection circuit 100 comprises a connector 110 and a processing circuit 120. The connector 110 comprises a first detection terminal 111 and a second detection terminal 112. The second detection terminal 112 is electrically connected to a first reference potential. In some embodiments, the first reference potential is a ground potential, but the disclosure is not limited thereto. The processing circuit 120 is electrically connected to the first detection terminal 111 and receives a power supply signal Vcc through a first resistor R1.

In some embodiments, the connector 110 is used for being electrically connected with a connecting port 200 and is used for receiving power or signals transmitted from an external device (such as a supply mains, a hard disk or a smart phone) through the connecting port 200, or transmitting the power or signals to the external device through the connecting port 200. The connecting port 200 comprises a third detection terminal 210 and a fourth detection terminal 220. When the first detection terminal 111 and the third detection terminal 210 are electrically connected, and the second detection terminal 112 and the fourth detection terminal 220 are electrically connected, the connecting port 200 and the connector 110 are "correctly connected". If the first detection terminal 111 is electrically connected to the third detection terminal 210, but the second detection terminal 112 is not connected to the fourth detection terminal 220, the connecting port 200 and the connector 110 are not "correctly connected", which occurs an error in signal transmission.

In some embodiments, the third detection terminal 210 and the fourth detection terminal 220 are electrically connected with each other, so that when the connector 110 is correctly connected to the connecting port 200, the first detection terminal 111 is electrically connected with the second detection terminal 112 through the third detection terminal 210 and the fourth detection terminal 220 in the connecting port 200, so as to form an electrical loop. The processing circuit 120 detects a detection potential Va on the first detection terminal 111, so as to determine whether the connector 110 is correctly connected to the connecting port 200.

In an embodiment, the power supply potential Vcc is 2 V, if the connector 110 is not correctly connected to the connecting port 200, no electrical loop is formed between the first detection terminal 111 and the second detection terminal 112. Therefore, the detection potential Va is high, that is, the detection potential is equal to the power supply potential Vcc. On the contrary, when the connector 110 is correctly connected to the connecting port 200, the electrical loop is formed between the first detection terminal 111 and the second detection terminal 112. Therefore, the detection potential Va on the first detection terminal 111 forms a potential value (such as 0.85 V) different from the power supply potential Vcc according to the impedance of the connecting port 200. The processing circuit 120 determines that the connector 110 is correctly connected to the connecting port 200 according to the special potential value of the detection potential Va and the processing circuit 120 executes a corresponding action.

Accordingly, the disclosure only needs to arrange the processing circuit 120 on the first detection terminal 111 instead of respectively arranging independent detection circuits on the two detection terminals 111 and 112, so that the cost of the detection circuit 100 is reduced.

In some embodiments, the processing circuit 120 further comprises a comparator 121 and a control circuit 122. A negative end of the comparator 121 is electrically connected to a second reference potential Vb, a positive end of the comparator 121 is electrically connected to the first detection terminal 111 and is used for receiving the detection potential Va, and an output end of the comparator 121 is used for outputting a notification signal according to a comparison result between the detection potential Va and the second reference potential Vb. In an embodiment, the power supply potential Vcc is 2 V, and the second reference potential Vb is 1.5 V. The control circuit 122 is electrically connected to the output end of the comparator 121 and is used for controlling the connector 110 to execute the corresponding actions according to the notification signal.

Based on the above, in some embodiments, the connector 110 further comprises multiple power terminals 113 and multiple signal terminals 114, and the connecting port 200 comprises multiple power terminals 230 and multiple signal terminals 240. Under the condition of the connector 110 and the connecting port 200 are correctly connected, the power terminals 113 and 230 are electrically connected, and the signal terminals 114 and 240 are electrically connected. When the detection potential Va is less than the second reference potential Vb, the notification signal output by the comparator 121 is changed. The control circuit 122 confirms that the connector 110 and the connecting port 200 are correctly connected, and controls a power supply unit (such as a battery) to transmit power to the connecting port 200 through the power terminals 113, or to transmit data to the connecting port 200 through the signal terminals 114.

In an embodiment, the power supply potential Vcc is 2 V and the second reference potential Vb is 1.5 V, if the detection potential Va is 0.85 V due to a voltage-divider theorem (rule), the notification signal output by the comparator 121 is converted from a high potential to a low potential to allow the control circuit 122 performs power transmission or data transmission.

In some embodiments, the processing circuit 120 further comprises an analog-to-digital circuit 123. The analog-to-digital circuit 123 is electrically connected to the first detection terminal 111 and the control circuit 122. and the analog-to-digital circuit 123 converts the detection potential Va into a digital notification signal and transmits the digital notification signal to the control circuit 122, so that the control circuit 122 acquires the value of the detection potential Va. In some embodiments, the detection circuit 100 stores analysis data, so that the processing circuit 120 determines the type of the external device corresponding to the connecting port 200 according to the detection potential Va. A comparison table of the analysis data, as shown below:

TABLE I

| Device | Impedance value (Ohm) | Detection potential (Volt) |
| --- | --- | --- |
| Type I | 10 | 0.45 |
| Type II | 50 | 1.66 |
| Type III | 100 | 2.5 |

As shown in the above table and referring to FIG. 1, in some embodiments, a detection resistor R250 is configured in the connecting port 200 (or the external device). The resistance of the detection resistor R250 corresponds to the connecting port 200 or the type of the external device. In an embodiment, when the connector 110 and the connecting port 200 are correctly connected, the magnitude of the detection potential Va varies with the resistance of the detection resistor R250 according to the voltage-divider theorem. Therefore, the detection potential Va reflects the actual resistance of the detection resistor R250. The control circuit 122 acquires the resistance value of the detection resistor R250 according to the analysis data after receiving the digital notification signal, and then determines the type of the device corresponding to the connecting port 200. The correspondence between an impedance value and the type of the device is a specification well known in the industry and is not described here. The detection circuit 100 notifies an electronic device to execute corresponding actions (such as to transmit signals or power) or to adjust parameters (such as to adjust a voltage value output to the external device) according to different types of devices. In some embodiments, the control circuit 122 controls power values output by the power terminals 113, so as to correctly drive the connecting port 200 or the corresponding external device.

In some embodiments, the detection circuit 100 further comprises a protection circuit 130. The protection circuit 130 is electrically connected between the processing circuit 120 and the first detection terminal 111, and comprises a switch transistor 131 and a second resistor R2. The control end of the switch transistor 131 receives power supply voltage Vcc through the second resistor R2, so that the switch transistor 131 is switched on or switched off according to the power supply voltage Vcc. In some embodiments, the switch transistor 131 comprises a high-voltage transistor used for avoiding damage to the detection circuit 100 caused by a surge generated on the connecting port 200.

Figure 2:
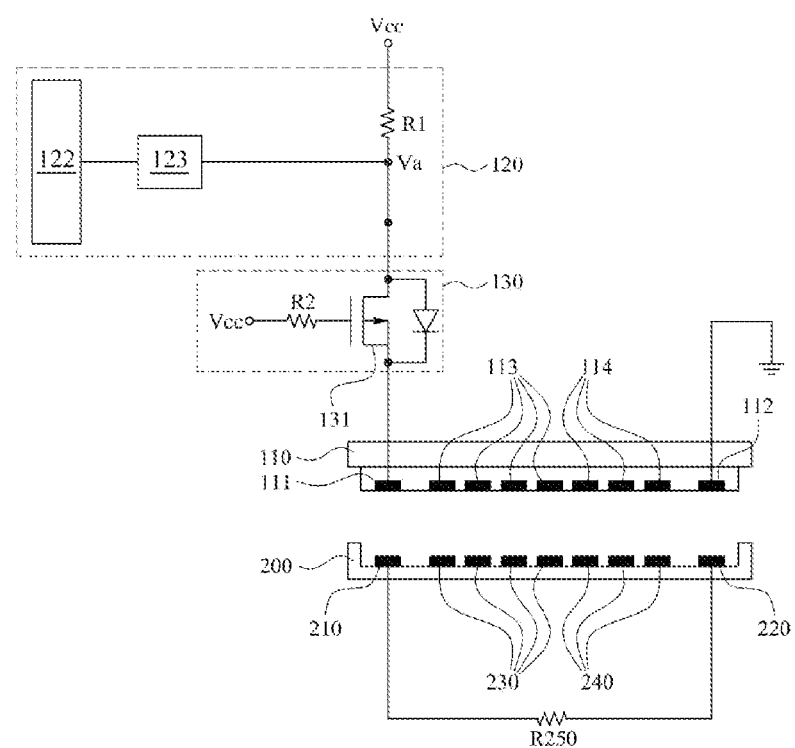
FIG. 2 is a schematic diagram showing a detection circuit drawn according to some embodiments of the disclosure.

Referring to FIG. 2, another embodiment of a detection circuit 150 is shown, in which no comparator needs to be arranged in the processing circuit 120 of the detection circuit 150. The processing circuit 120 directly converts the detection potential Va into the digital notification signal only through the analog-to-digital circuit 123 and transmits it to the control circuit 122. In this embodiment, the first end of the analog-to-digital circuit 123 is electrically connected to the first detection terminal 111 and is used for converting the detection potential Va into the digital notification signal. The second end of the analog-to-digital circuit 123 is electrically connected to the control circuit 122, so that the control circuit 122 is used for controlling the power terminals 113 to transmit power to the connecting port 200 or controlling the signal terminals 114 to transmit data to the connecting port 200 according to the digital notification signal.

In some embodiments, the connector 110 is a USB-TypeC transmission interface, and the connecting port 200 has a double-face plugging function, but the application of the disclosure is not limited thereto. In addition, in some embodiments, the power terminals 113 and the signal terminals 114 are arranged between the first detection terminal 111 and the second detection terminal 112. That is, the first detection terminal 111 and the second detection terminal 112 are located on two sides of the connector 110.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A detection circuit applied to a connecting port, comprising:

a connector, comprising a first detection terminal and a second detection terminal, wherein the second detection terminal is electrically connected to a first reference potential; and a processing circuit, electrically connected to the first detection terminal and is configured to receive a power supply signal, wherein the connector is configured to be connected to the connecting port, the first detection terminal is electrically connected with the second detection terminal through the connecting port, and the first detection terminal is configured to be connected to a detection resistor of the connecting port, so that the processing circuit detects a detection potential on the first detection terminal, and a magnitude of the detection potential varies with a resistance of the detection resistor.

2. The detection circuit according to claim 1, wherein the processing circuit further comprises:

a comparator, wherein a negative end of the comparator is electrically connected to a second reference potential, a positive end of the comparator is electrically connected to the first detection terminal and is configured to receive the detection potential, and an output end of the comparator is configured to output a notification signal; and a control circuit, electrically connected to the output end of the comparator and is configured to control a power supply unit to transmit power to the connecting port through a plurality of power terminals of the connecting port on the connector according to the notification signal.

3. The detection circuit according to claim 2, wherein the processing circuit further comprises:

an analog-to-digital circuit, electrically connected to the first detection terminal and the control circuit and configured to convert the detection potential into a digital notification signal and transmitting the digital notification signal to the control circuit.

4. The detection circuit according to claim 3, wherein the control circuit is configured to control power values output by the multiple power terminals according to analysis data after receiving the digital notification signal.

5. The detection circuit according to claim 1, wherein the detection circuit further comprises a protection circuit, electrically connected between the processing circuit and the first detection terminal.

6. The detection circuit according to claim 1, wherein the processing circuit comprises:

an analog-to-digital circuit, wherein the first end of the analog-to-digital circuit is electrically connected to the first detection terminal and is configured to convert the detection potential into a digital notification signal; and a control circuit, electrically connected to the second end of the analog-to-digital circuit and is configured to implement transmission between multiple power terminals on the connector and the connecting port according to the digital notification signal.

7. The detection circuit according to claim 6, wherein the control circuit is configured to control power values output by the multiple power terminals according to analysis data after receiving the digital notification signal.

8. The detection circuit according to claim 1, wherein the connector further comprises multiple power terminals, and the multiple power terminals are arranged between the first detection terminal and the second detection terminal.

* * * * *